United States Patent
Lin et al.

(10) Patent No.: US 11,919,336 B2
(45) Date of Patent: Mar. 5, 2024

(54) SELF-POWERED SENSING AND TRANSMITTING DEVICE

(71) Applicant: INDUSTRIAL TECHNOLOGY RESEARCH INSTITUTE, Hsinchu (TW)

(72) Inventors: Chia-Hsin Lin, Hsinchu (TW); Min-Yan Dong, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 618 days.

(21) Appl. No.: 17/104,214

(22) Filed: Nov. 25, 2020

(65) Prior Publication Data
US 2021/0155059 A1 May 27, 2021

Related U.S. Application Data (60) Provisional application No. 62/941,017, filed on Nov. 27, 2019.

(51) Int. Cl.
*B60C 23/04* (2006.01)
*H02N 2/18* (2006.01)
*H10N 30/88* (2023.01)

(52) U.S. Cl.
CPC ...... *B60C 23/0411* (2013.01); *B60C 23/0493* (2013.01); *H02N 2/18* (2013.01); *H10N 30/88* (2023.02); *H02N 2/186* (2013.01)

(58) Field of Classification Search
CPC ... B60C 23/0411; B60C 23/0493; H02N 2/18; H02N 2/186; H10N 30/88
See application file for complete search history.

(56) References Cited

U.S. PATENT DOCUMENTS 5,781,104 A * 7/1998 Huang ................ B60C 23/0433
340/447
6,048,622 A 4/2000 Hagood, IV et al.
(Continued)

FOREIGN PATENT DOCUMENTS

CN 1331689 8/2007
CN 101326065 12/2008
(Continued)

OTHER PUBLICATIONS

Taiwanese Office Action for Taiwanese Patent Application No. 109141302 dated Dec. 30, 2021.
(Continued)

*Primary Examiner* — Jill E Culler
(74) *Attorney, Agent, or Firm* — Amin, Turocy & Watson, LLP (57) ABSTRACT

A self-powered sensing and transmitting device is provided and includes a piezoelectric generator, a carrying structure stacked with the piezoelectric generator, an encapsulation support structure including an encapsulation portion encapsulating the piezoelectric generator and the carrying structure and two supporting portions connected to two ends of the encapsulation portion, and a fixed support structure for being correspondingly coupled with the two supporting portions and fixed on a flexible surface. The self-powered sensing and transmitting device can be applied to a tire monitoring system and a motion monitoring system.

21 Claims, 9 Drawing Sheets

(56) References Cited

U.S. PATENT DOCUMENTS

| | | | |
|---|---|---|---|
| 6,629,341 B2 * | 10/2003 | Wilkie | H10N 30/06 |
| | | | 29/609.1 |
| 6,725,713 B2 | 4/2004 | Adamson et al. | |
| 6,885,291 B1 | 4/2005 | Pollack et al. | |
| 7,047,800 B2 | 5/2006 | Thiesen et al. | |
| 7,183,937 B2 * | 2/2007 | Park | B60C 23/0411 |
| | | | 73/146 |
| 7,343,787 B2 * | 3/2008 | Oflaz | B60C 23/20 |
| | | | 73/146 |
| 7,567,017 B2 | 7/2009 | Yoon et al. | |
| 10,035,385 B2 | 7/2018 | Fontaine et al. | |
| 2005/0074638 A1 | 4/2005 | Neubert et al. | |
| 2006/0021261 A1 | 2/2006 | Face | |
| 2009/0114005 A1 | 5/2009 | Blixhavn et al. | |
| 2013/0181578 A1 | 7/2013 | Kameda et al. | |
| 2015/0020585 A1 | 1/2015 | Dussinger et al. | |

FOREIGN PATENT DOCUMENTS

| | | | | |
|---|---|---|---|---|
| CN | 101990717 | 3/2011 | | |
| CN | 102069686 | 5/2011 | | |
| CN | 102371856 | 3/2012 | | |
| CN | 104220278 | 12/2014 | | |
| CN | 104302490 | 1/2015 | | |
| CN | 104337107 | 2/2015 | | |
| CN | 105099264 | 11/2015 | | |
| CN | 107471927 | 12/2017 | | |
| CN | 208544059 | 2/2019 | | |
| CN | 109738095 | 5/2019 | | |
| CN | 214057141 | 8/2021 | | |
| EP | 1614552 | 1/2006 | | |
| FR | 2745476 | 9/1997 | | |
| GB | 2064883 | 6/1981 | | |
| JP | 2004-053329 | 2/2004 | | |
| JP | 2006-023311 | 1/2006 | | |
| JP | 2006023311 A | * | 1/2006 | ......... B60C 23/0493 |
| JP | 2012-126396 | 7/2012 | | |
| JP | 2018-157950 | 10/2018 | | |
| TW | M396766 | 1/2011 | | |
| TW | 201515872 | 5/2015 | | |
| TW | M609142 | 3/2021 | | |
| WO | 99/41093 | 8/1999 | | |
| WO | 2007/113252 | 10/2007 | | |

OTHER PUBLICATIONS

Japanese Office Action for Japanese Patent Application No. 2020-195269 dated Jan. 31, 2022.
Extended European Search Report for European Patent Application No. 20000428.1 dated Mar. 19, 2021.
Chinese Office Action for Chinese Patent Application No. 202011336843.0 dated Feb. 28, 2023.
Chinese Office Action for Chinese Patent Application No. 202011336843.0 dated Jun. 9, 2022.

* cited by examiner

SELF-POWERED SENSING AND TRANSMITTING DEVICE

BACKGROUND

1. Technical Field

The present disclosure relates to a self-powered sensing and transmitting device, and more particularly, to a device using piezoelectricity for sensing and transmitting.

2. Description of Related Art

Despite the fact that Tire Pressure Monitoring System (TPMS) has been a standard motor vehicle equipment in many parts of the world, road accidents caused by tire blowouts still happen very frequently. Although the causes for tire blowouts are intricate, insufficient tire pressure remains one of the main causes.

A traditional commercial TPMS is typically powered by a disposable battery. When the pressure is above the lower limit of the TPMS, detection and transmission frequency is set to once every 30 to 60 seconds in order to conserve power. If the detection and transmission frequency is increased, the power of the disposable battery can soon be depleted. In addition, since the environment in the tires is usually high in both temperature and humidity, the disposable battery in the traditional commercial TPMS is usually sealed by an encapsulant, which cannot be replaced by consumers. As such, the adoption of the TPMS still fails to prevent tire blowouts. One reason may be that the interval between detections and transmissions of tire pressure information is too long, which suggests a poor safety factor.

In addition, the traditional commercial TPMS is screwed on the rim (e.g., aluminum rim) of a tire. Therefore, it can only detect the air pressure and/or temperature in the tire, but not parameters that best reflect the conditions of the tire that is in contact with the ground, such as the thickness of the tire, the acceleration, the vertical load, etc. In fact, it is imperative to be able to detect the irregular vibrations that often precede a tire blowout.

SUMMARY

In an embodiment, a self-powered sensing and transmitting device of the present disclosure includes a piezoelectric generator, a carrying structure stacked with the piezoelectric generator, an encapsulation support structure including an encapsulation portion encapsulating the piezoelectric generator and the carrying structure and two supporting portions connected to two ends of the encapsulation portion, and a fixed support structure for being correspondingly coupled with the two supporting portions and fixed on a flexible surface.

DETAILED DESCRIPTION

The ways in which the present disclosure can be implemented are illustrated with the following embodiments. One of ordinary skill in the art can readily appreciate other advantages and technical effects of the present disclosure based on the disclosed contents herein. It should be noted that the structures, ratios, sizes shown in the appended drawings are to be construed in conjunction with the disclosures herein in order to facilitate understanding of those skilled in the art. They are not meant, in any way, to set boundaries by which the present disclosure can be implemented, and therefore without influencing the effects created and the objectives achieved by the present disclosure, any modifications, changes or adjustments should fall within the scope encompassed by the technical contents disclosed herein. Furthermore, a reference numeral recited in a paragraph of the specification, if not appearing in the drawing to which the paragraph refers to, may otherwise be found in other drawings of the present disclosure.

Figure 1A:
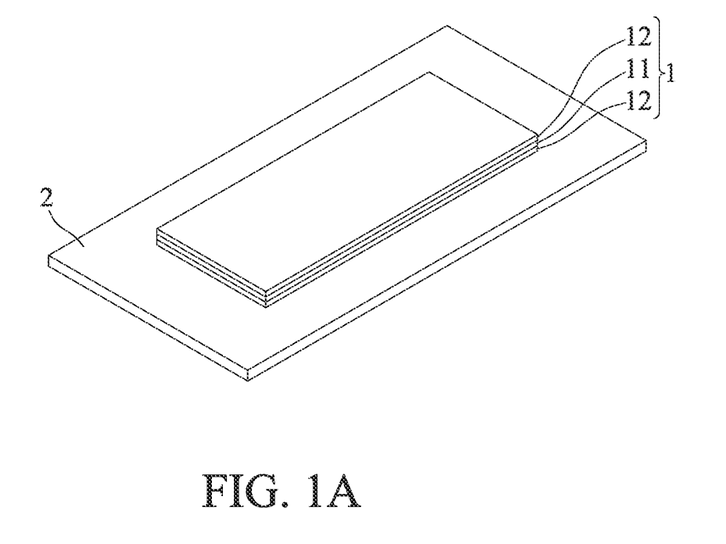
FIGS. 1A and 1B are schematic diagrams depicting a piezoelectric generator and a carrying structure of a self-powered sensing and transmitting device in accordance with the present disclosure.
Figure 1B:
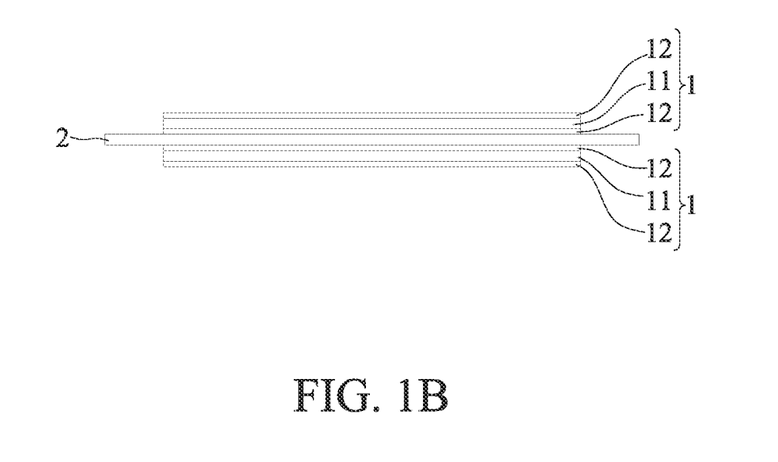
Figure 2:
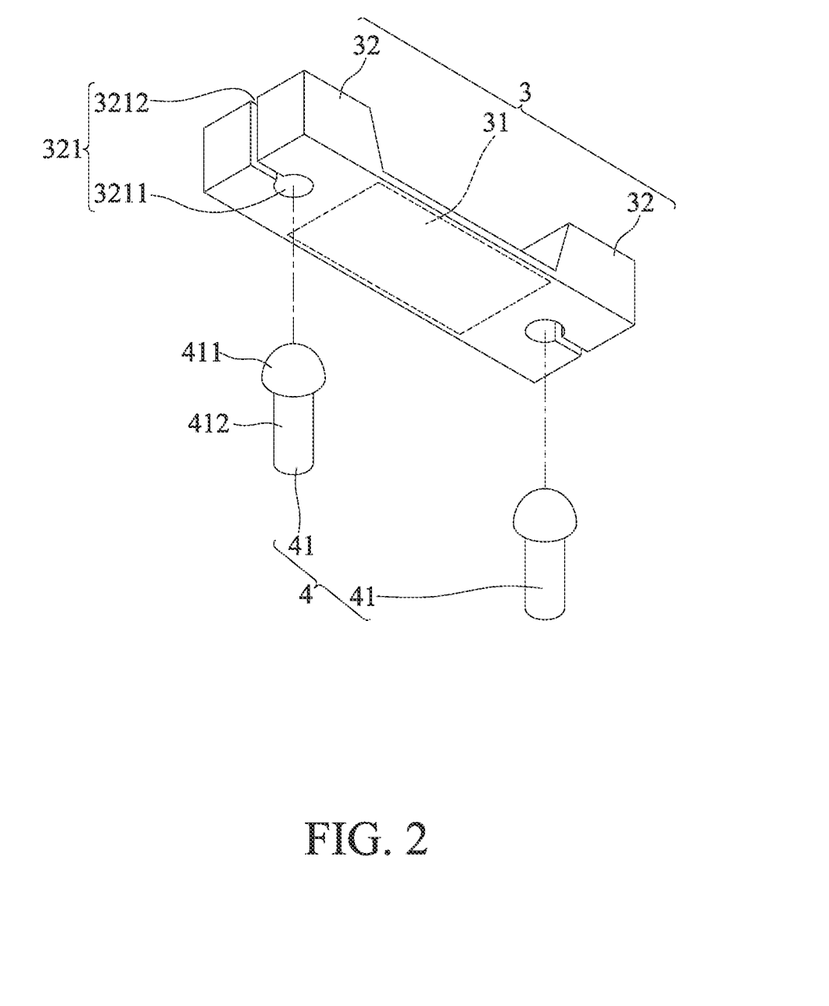
FIG. 2 is a schematic diagram depicting an encapsulation support structure and a fixed support structure of the self-powered sensing and transmitting device in accordance with the present disclosure.

Referring to FIGS. 1A, 1B and 2, a self-powered sensing and transmitting device of the present disclosure includes a piezoelectric generator 1, a carrying structure 2, an encapsulation support structure 3 and a fixed support structure 4.

The piezoelectric generator 1 includes a piezoelectric thin film 11 and two conductive electrodes 12 on the upper and lower sides of the piezoelectric thin film 11, and is stacked with the carrying structure 2. The piezoelectric generator 1 is, for example, a piezoelectric ceramic generator. The carrying structure 2 is, for example, an elastic thin metal plate. As shown in FIG. 1A, the piezoelectric generator 1 is adhered to one side of the carrying structure 2; or as shown in FIG. 1B, the piezoelectric generators 1 are adhered to two opposite sides of the carrying structure 2, such that when the carrying structure 2 is deformed as a result of mechanical energy, the piezoelectric generator 1 can convert the mechanical energy into electrical energy.

The encapsulation support structure 3 includes an encapsulation portion 31 for encapsulating the piezoelectric generator 1 and the carrying structure 2, and two supporting portions 32 connected to two ends of the encapsulation portion 31. The encapsulation support structure 3 can be made of an elastic or moldable material, such as rubber, silicone or plastic. It should be noted that the encapsulation portion 31 and the supporting portions 32 are basically integrally formed, such that the two supporting portions 32 function like bridge piers supporting the encapsulation portion 31 and allow the encapsulation portion 31 in which the piezoelectric generator 1 and the carrying structure 2 are encapsulated to vibrate under the support of the two supporting portions 32.

Figure 3:
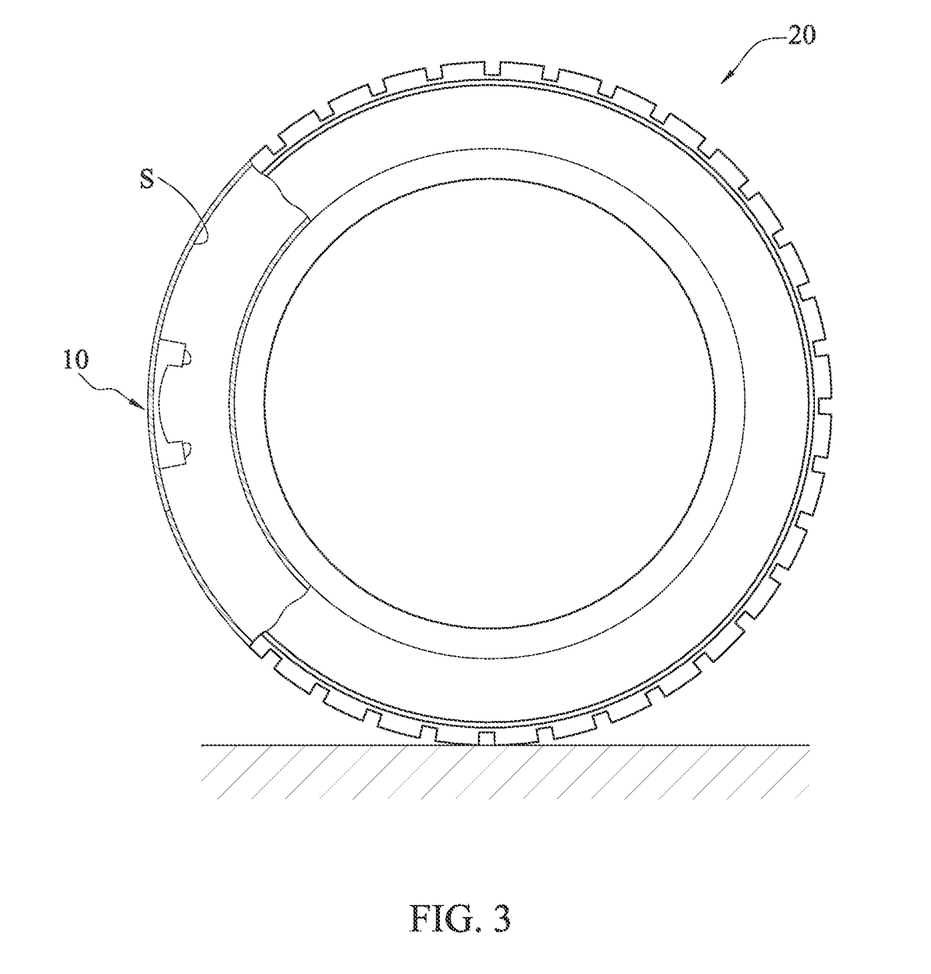
FIG. 3 is a schematic diagram depicting the self-powered sensing and transmitting device in accordance with the present disclosure installed on a flexible surface.

The fixed support structure 4 is used for correspondingly coupling with the two supporting portions 32, and the fixed support structure 4 is fixed on a flexible surface S. As shown in FIG. 3, in an embodiment, a self-powered sensing and transmitting device 10 of the present disclosure can be installed on the flexible surface S, which is, for example, the inner surface of a tire 20 (see FIG. 3), or for example, the inner surface of a shoe 30 (see FIG. 8).

Referring to FIG. 2 again, the fixed support structure 4 includes two first mating components 41, while each of the two supporting portions 32 includes a second mating component 321, wherein the first mating components 41 and the second mating components 321 are physically coupled together in an embedded fashion. For example, the first mating component 41 can be a convex component, and the second mating component 321 can be a concave component. More specifically, the first mating component 41 includes a head portion 411 and a neck portion 412, and the second mating component 321 includes a through hole 3211 penetrating through the supporting portion 32 and an opening 3212 extending from the through hole 3211 to an edge of the supporting portion 32. Furthermore, the size (width) of the opening 3212 is substantially smaller than or equal to the size (width) of the neck portion 412. The first mating component 41, or more specifically, the neck portion 412 having a smaller dimension relative to the head portion 411 is forced into the through hole 3211 from the opening 3212 of the second mating component 321. In this process, since the first mating component 41 has characteristics similar to those of a rubber plug, the neck portion 412 will be slightly squeezed by the edges of the opening 3212 when passing through the opening 3212, and then be allowed to return to its original shape once it reaches the through hole 3211. At this point, the head portion 411 prevents the first mating component 41 from passing through the through hole 3211, thereby accomplishing the correspondingly coupling between the fixed support structure 4 and the encapsulation support structure 3. On the other hand, the first mating component 41 of the fixed support structure 4 can be a concave component, and the second mating component 321 of the encapsulation support structure 3 can be a convex component, thereby accomplishing the correspondingly coupling between the fixed support structure 4 and the encapsulation support structure 3.

Figure 4A:
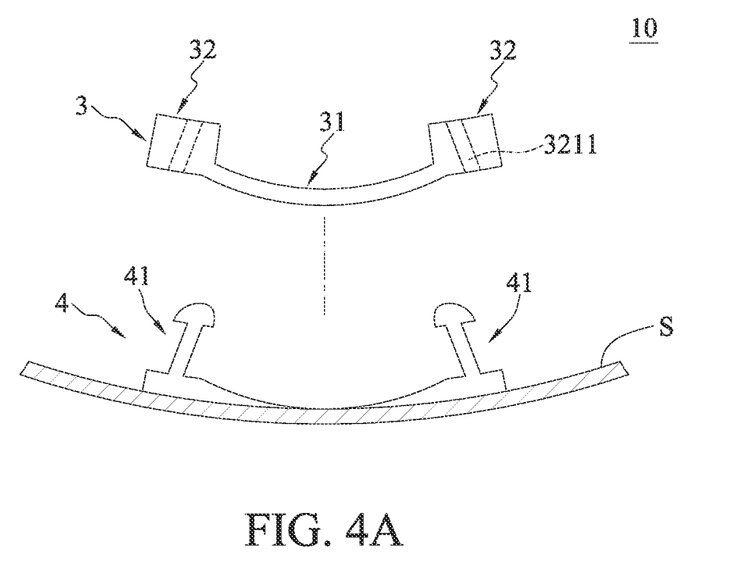
FIGS. 4A and 4B are schematic diagrams depicting corresponding couplings of the encapsulation support structure and the fixed support structure of the self-powered sensing and transmitting device in accordance with the present disclosure.
Figure 4B:
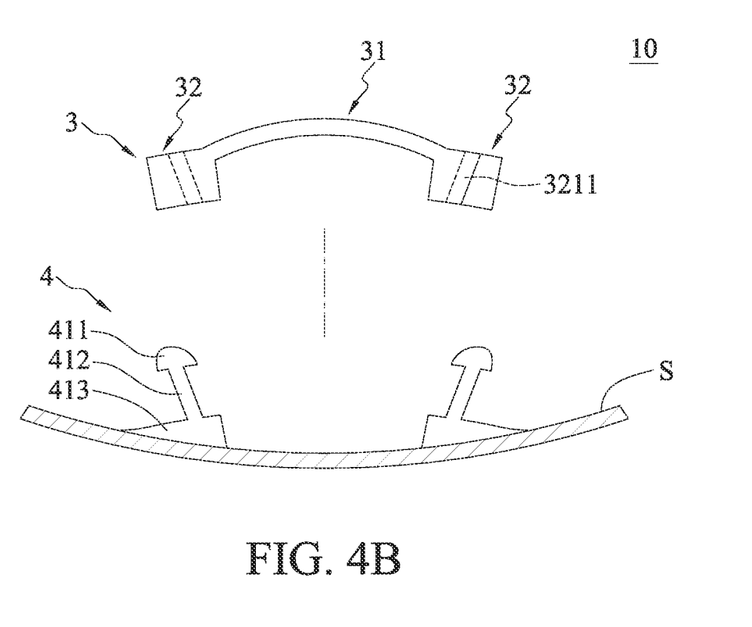

Referring to FIGS. 4A and 4B, schematic diagrams depicting fixed support structures 4 installed on flexible surfaces S are shown. First, the fixed support structure 4 can be attached to the flexible surface S by an adhesive, for example. In an embodiment, as shown in FIG. 3, the fixed support structure 4 is attached to the inner crown area of the tire. Alternatively, the fixed support structure 4 can be integrally formed by molding during manufacturing of the tire. Simply put, the fixed support structure 4 is fixed on the flexible surface S and cannot be easily removed. In addition, the correspondingly coupling of encapsulation support structure 3 with the fixed support structure 4 is carried out in such a way that the radius of curvature of the encapsulation portion 31 is smaller than or equal to the radius of curvature of the flexible surface S, so the curvature of the encapsulation portion 31 is greater than or equal to the curvature of the flexible surface S. In other words, the fixed support structure 4 applies a pre-stress on the encapsulation support structure 3. It should be noted that the degree to which the flexible surface S is curved (i.e., the curvature) is defined as the reciprocal of the radius, i.e., the smaller the radius, the larger the curvature. The radius of curvature of a plane is infinite.

For installation, force is first exerted on the encapsulation support structure 3 to bend it slightly, such that the two supporting portions 32 of the encapsulation support structure 3 fit between the two first mating components 41. Then, the openings 3212 of the supporting portions 32 are aligned with the first mating components 41, meanwhile force exerted upon the encapsulation support structure 3 is eased slightly to cause the first mating components 41 to squeeze pass the openings 3212 and into the through holes 3211. Once the first mating components 41 are correspondingly coupled with the supporting portions 32, the encapsulation portion 31 is pre-stressed.

As shown in FIG. 4A, the fixed support structure 4 includes two first mating components 41. In the drawing, each of the first mating components 41 includes, from top to bottom, a head portion, a neck portion and a base portion, wherein the two base portions can be separated from each other or integrally formed. The two first mating components 41 become progressively closer to each other as they extend further away from the flexible surface S (i.e., extending in a tapered fashion). The encapsulation portion 31 bends towards the direction of the flexible surface S (i.e., the center of the encapsulation portion 31 is closer to the flexible surface S than the two supporting portions 32), and the encapsulation portion 31 can partially touch the flexible surface S or not at all. As such, when the flexible surface S is deformed (e.g., deformations of the inner surface of the tire due to rotations of the tire), mechanical energy is transferred to the encapsulation portion 31 being caused to vibrate, and the carrying structure 2 encapsulated in the encapsulation portion 31 is deformed by this mechanical energy, and the piezoelectric generator 1 converts the mechanical energy to electrical energy.

Figure 8:
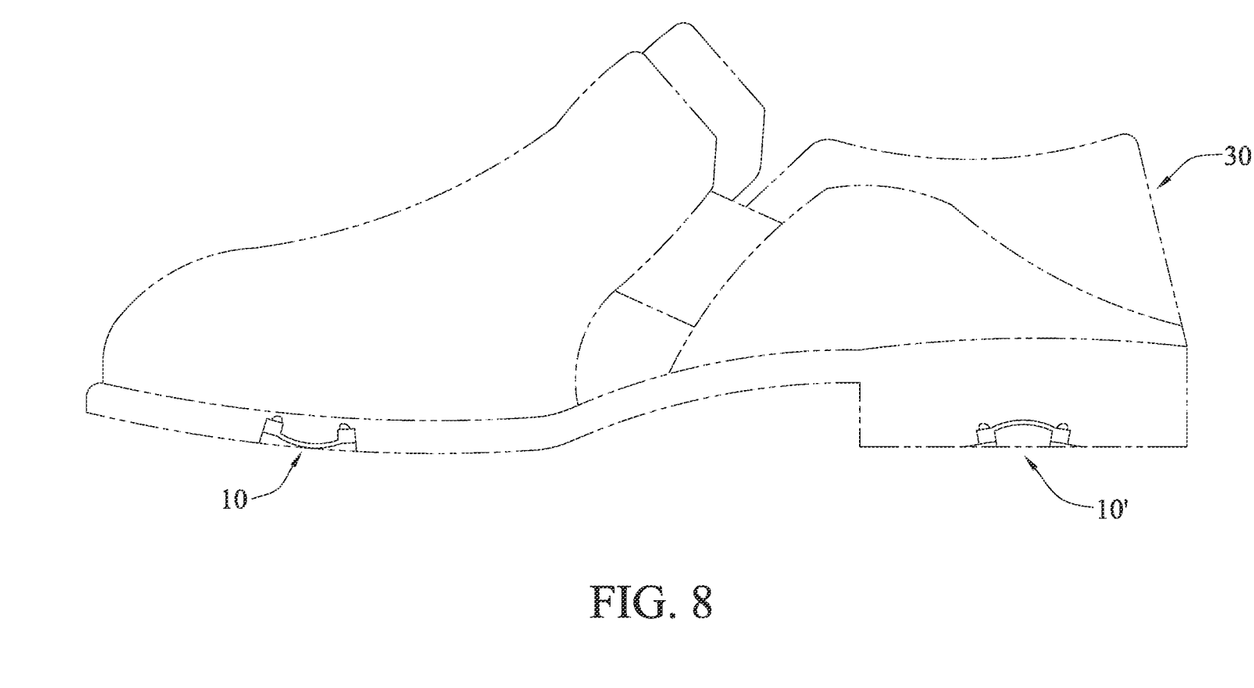
FIG. 8 is a schematic diagram depicting a self-powered sensing and transmitting device in accordance with the present disclosure installed on the inner surface of a shoe.

In another embodiment, the fixed support structure 4 is attached to the inner surface of a shoe, for example, as shown in FIG. 8. As shown in FIG. 4B, the fixed support structure 4 includes two first mating components 41, each of the first mating components 41 includes a head portion 411, a neck portion 412 and a base portion 413, wherein the two base portions 413 are in principle separated from each other. The two first mating components 41 become further apart from each other as they extend further away from the flexible surface S (i.e., extending in a progressively widening fashion). The encapsulation portion 31 bends in a direction away from the flexible surface S (i.e., the center of the encapsulation portion 31 is further from the flexible surface S than the two supporting portions 32), and the encapsulation portion 31 can partially touch the flexible surface S or not at all. As such, when the flexible surface S is deformed (e.g., deformations of the inner surface of the shoe caused by walking), mechanical energy is transferred to the encapsulation portion 31 being caused to vibrate, and the carrying structure 2 encapsulated in the encapsulation portion 31 is deformed by this mechanical energy, and the piezoelectric generator 1 converts the mechanical energy to electrical energy.

Figure 5A:
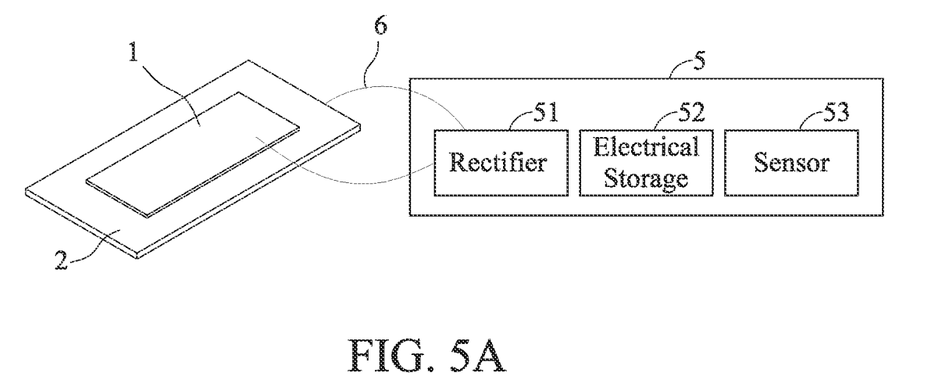
FIGS. 5A and 5B are schematic diagrams depicting a circuit module and connectors of the self-powered sensing and transmitting device in accordance with the present disclosure.
Figure 5B:
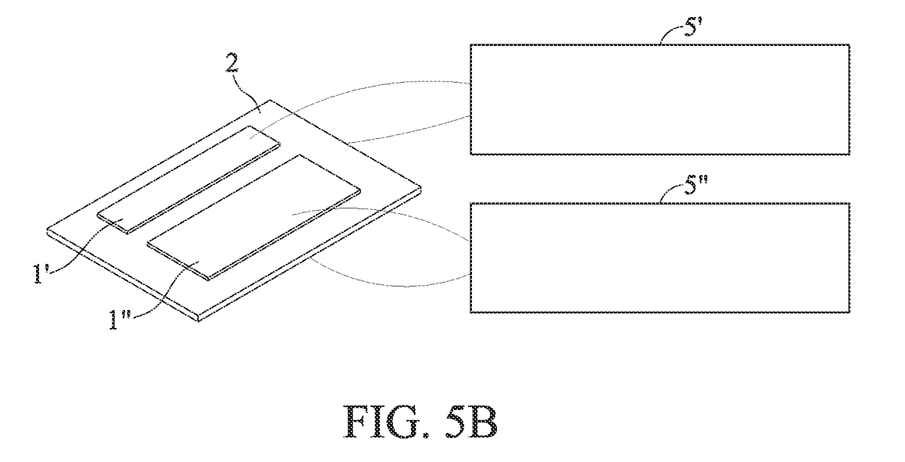

Referring to FIGS. 5A and 5B, the self-powered sensing and transmitting device of the present disclosure further includes a circuit module 5 and connectors 6 connecting the circuit module 5 to the piezoelectric generator 1 and the carrying structure 2, wherein the circuit module 5 and the connectors 6 can be encapsulated by the encapsulation portion 31 of the encapsulation support structure 3. In addition, the circuit module 5 includes a rectifier 51, an electrical storage 52 (e.g., a temporary storage control circuit or a rechargeable battery) and a sensor 53 (e.g., including a sensing module and a signal transmission module). The circuit module 5 rectifies and stores the alternating current generated by the piezoelectric generator 1 in the temporary storage control circuit, wherein a voltage regulating IC and a capacitor are used for controlling the output voltage level, and power can then be directly provided from the temporary storage control circuit to the sensing module and the signal transmission module for use. Alternatively, the circuit module 5 rectifies and stores the alternating current generated by the piezoelectric generator 1 to the rechargeable battery. When an accelerometer chip in the sensing module detects that the G value is greater than or equal to zero, power needed can be obtained from the rechargeable battery. In addition, the piezoelectric generator 1 can be provided as a single unit stacked on the carrying structure 2, as shown in FIG. 5A, or as a plurality of separate units individually stacked on the carrying structure 2, as shown in FIG. 5B, in which piezoelectric generators 1' and 1" are connected to their respective circuit modules 5' and 5". In an embodiment, a thin metal plate can be stacked on the piezoelectric generator 1, such that if a crack occurs in the piezoelectric generator 1, electrical conduction with the circuit module 5 can be maintained through the thin metal plate. In another embodiment, a conductive adhesive can be used for connecting the piezoelectric generator 1, the carrying structure 2 and the circuit module 5 to ensure proper electrical connections between the piezoelectric generator 1, the carrying structure 2 and the circuit module 5 during vibrations of the carrying structure 2. In yet another embodiment, an encapsulation conductive adhesive can be used for encapsulating the piezoelectric generator 1 with the circuit module 5, and the carrying structure 2 with the circuit module 5, so as to ensure proper electrical connections with the circuit module 5.

In an embodiment, for example, when the vehicle stops, it will be difficult for the self-powered sensing and transmitting device to capture energy, so a circuit with a minimum loss of electrical energy can be designed, in which the alternating current generated by the piezoelectric generator 1 is rectified and stored in the electrical storage 52 of the circuit module 5 (e.g., a temporary storage control circuit or a rechargeable battery) with a voltage regulating IC and a capacitor for controlling the level of the output voltage, and power is directly provided from the electrical storage 52 for use by a load of the sensor 53 (e.g., including a sensing module and a signal transmitting module). In another embodiment, for example, in order to reduce the risk of puncturing of the device when on the road, the piezoelectric generator 1 can be designed as two separate units, or as two electrode areas cut on the same ultra-thin piezoelectric ceramic to form two separate generators. In addition, the alternating current generated by one of the piezoelectric generators can be rectified and stored in the electrical storage 52 of the circuit module 5 (e.g., a temporary storage control circuit or a rechargeable battery), and when the G value sensed by the accelerometer is greater than zero (i.e., when vehicle is moving), then the sensor 53 is directly powered by the electrical energy generated by this piezoelectric generator. At the same time, electrical energy generated by the other generator while the vehicle is moving can be inputted into the electrical storage 52 instead of being used to power the load. It only supplies electricity when the vehicle is stationary and detection is required.

Therefore, based on the above descriptions in conjunction with FIGS. 1A, 1B, 2, 3, 4A-4B and 5A-5B, the fixed support structure 4 of the self-powered sensing and transmitting device 10 of the present disclosure can be secured onto the flexible surface S (inner surface of the tire), and the piezoelectric generator 1, the carrying structure 2, the circuit module 5 and the connectors 6 can be encapsulated by the encapsulation support structure 3 as one unit. The correspondingly coupling between the supporting portions 32 and the fixed support structure 4 allows the encapsulation portion 31 to have a radius of curvature that is smaller than or equal to the radius of curvature of the flexible surface S, and the encapsulation portion 31 can partially touch the flexible surface S or not at all, so as to create vibrations during deformation of the flexible surface S.

Moreover, in an embodiment, the electrical storage 52 of the circuit module 5 can be designed to replace disposable batteries. By capturing the energy of a rotating tire by the piezoelectric generator 1 that has an adjustable curvature, sufficient electrical energy can be generated to provide the power needed by the sensing module (e.g., the temperature and tire pressure sensors and the accelerometer) and the signal transmission module. In other words, the self-powered sensing and transmitting device 10 of the present disclosure is applicable to TPMS, and can be designed as a detachable and reusable tire parameter sensing device that can be attached to the inner wall of a tire, and can be removed from the old tire reaching the end of its life and installed on a new tire to be used again.

Figure 6A:
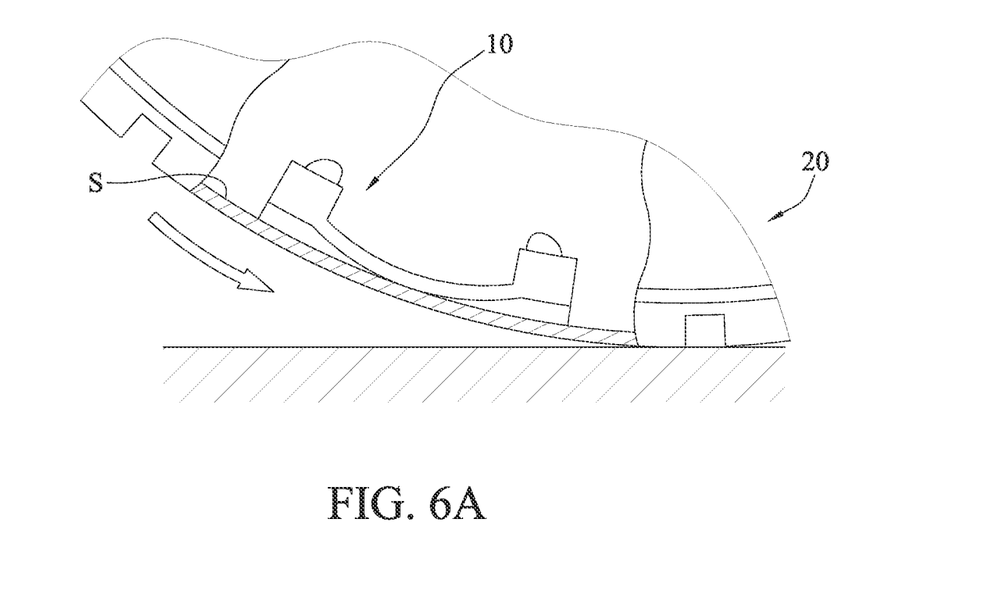
FIGS. 6A to 6C are schematic diagrams depicting a self-powered sensing and transmitting device in accordance with the present disclosure installed on the inner surface of a tire and coming into contact with the ground as the tire rotates.
Figure 6B:
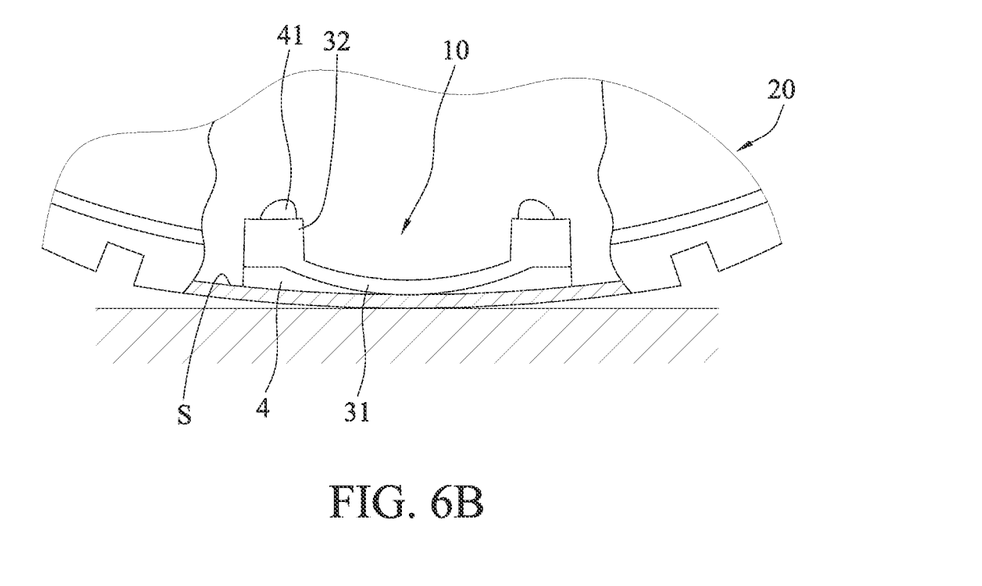
Figure 6C:
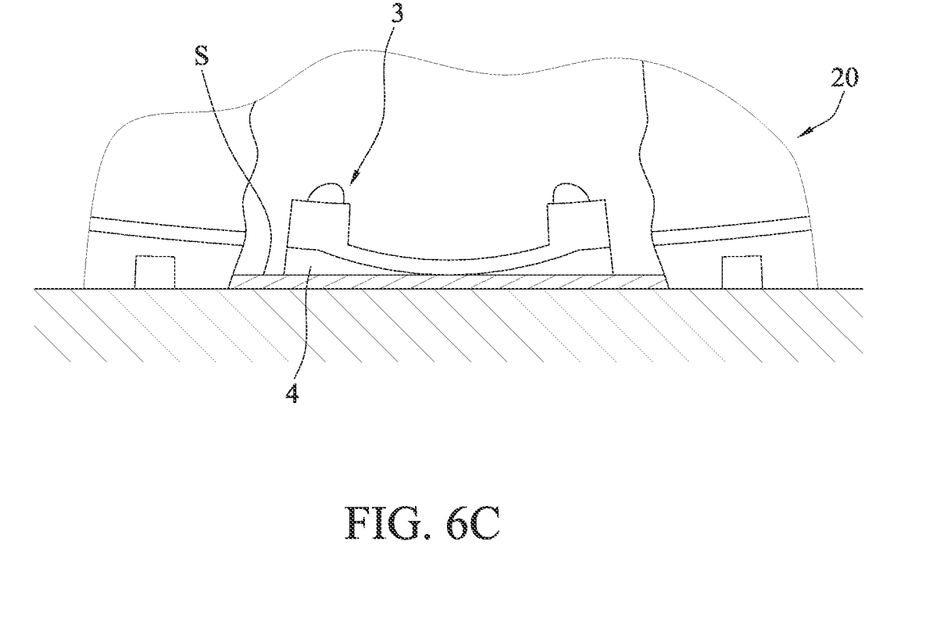

Referring to FIG. 6A and in conjunction with FIGS. 1A, 1B and 2, in an embodiment, as shown in FIG. 6A, when the tire 20 starts to rotate, the self-powered sensing and transmitting device 10 receives mechanical energy, and the carrying structure 2 is deformed to cause vibrations in the piezoelectric generator 1. The piezoelectric generator 1 already has a radius of curvature smaller than that of the inner wall of the tire. As shown in FIG. 6B, during rotation of the tire 20, the self-powered sensing and transmitting device 10 receives mechanical energy, the carrying structure 2 is deformed to cause vibrations in the piezoelectric generator 1. As shown in FIG. 6C, when a portion of the tire 20 is flat against the ground, the deformation of the carrying structure 2 in the encapsulation portion 31 is at the greatest, and the degree of vibration and the radius of curvature of the piezoelectric generator 1 are also at the greatest. Therefore, with the rotations of the tire 20, the self-powered sensing and transmitting device 10 installed in the inner surface of the tire can provide power to itself in order to perform sensing and signal transmissions.

Next, the relationship between the radius of curvature of the piezoelectric generator and the voltage generated is explained using Table 1A below. A piezoelectric ceramic with a size of 75 mm*30 mm*0.04 m (Lp*Wp*Tp) is used as the piezoelectric generator, and a metal plate with a size of 100 mm*32 mm*0.1 mm (L*W*T) is used as the carrying structure. The piezoelectric generator is connected to a load of 1 kΩ, and the load voltage ($V_{max}$) is measured.

TABLE 1A

| | Radius of Curvature (cm) | | | | | |
|---|---|---|---|---|---|---|
| | 15 | 20 | 25 | 30 | 35 | 40 |
| Voltage (V) | 9.3 | 7.4 | 6.3 | 3.4 | 2.5 | 1.9 |

As can be seen from Table 1A, the smaller the radius of curvature of the piezoelectric ceramic, the larger the voltage generated.

The relationships between the thickness the piezoelectric generator and the voltage and current generated are explained using Table 1B below. A piezoelectric ceramic with a size of 75 mm*30 mm is used as the piezoelectric generator, and a metal plate with a size of 100 mm*32 mm*0.1 mm (L*W*T) is used as the carrying structure. The radius of curvature of the piezoelectric ceramic is 15 cm. The piezoelectric generator is connected to a load of 1 kΩ, and the load voltage ($V_{max}$) is measured.

TABLE 1B

| Thickness (mm) | 0.04 | 0.07 | 0.1 | 0.12 | 0.15 |
|---|---|---|---|---|---|
| Voltage (V) | 9.3 | 11.2 | 14.5 | 15.1 | 16.7 |
| Current (mA) | 18 | 15 | 12 | 8 | 7 |

As can be seen from Table 1B, the smaller the thickness of the piezoelectric ceramic, the larger the electrical energy generated.

Referring to Tables 2A and 2B below, the self-powered sensing and transmitting device of the present disclosure is installed in the inner surface of a tire to create a smart tire. More specifically, the fixed support structure of the self-powered sensing and transmitting device is secured to the inner surface of the tire or integrally formed with the tire, and the encapsulation support structure of the self-powered sensing and transmitting device is correspondingly coupled with the fixed support structure to facilitate removal. Next, feasibility of the applications of the present disclosure is illustrated below using a standard 16-inch (about 35 cm) sedan tire and a truck tire (about 65 cm). The sedan tire is essentially composed of a special rubber embedded with multilayers of steel wire coils, and the truck tire has even more layers of steel wire coils tightly embedded in the rubber, therefore, during testing, signals are transmitted using a radio frequency of 433 MHz for the sedan tire, and using Bluetooth communication method of 2.4 GHz for the truck tire.

For Table 2A, the self-powered sensing and transmitting devices of the present disclosure are installed at the centers of the inner crowns of the tires in conformity with the tires (i.e., with the same radius of curvature). The generator used in the sedan tire is a single ultra-thin piezoelectric ceramic with a thickness of 45 μm; while the generator used in the truck tire is composed of two ultra-thin piezoelectric ceramics (a bimorph) with a same thickness of 45 Inn and a slighter larger area. The two piezoelectric ceramics are stacked on the same metal plate as a bimorph to save space. Test conditions start from a standstill and accelerate to a maximum of 120 km/h. The tires are run at 30 km/h, 60 km/h, and 120 km/h for 1 hour, respectively. Signal receivers are placed ten meters away from the tires and intervals of transmitted signals related to tire pressure, temperature and acceleration are recorded.

TABLE 2A

| Area of Piezoelectric Generator (cm$^2$) | Type of Tires Tested (radius of curvature in cm) | Static Capacitance (μF) | Signal Transmission Method | 30 km/h Signal Transmission Interval (sec) | 60 km/h Signal Transmission Interval (sec) | 120 km/h Signal Transmission Interval (sec) |
|---|---|---|---|---|---|---|
| 15 cm$^2$ | 16 inch Sedan Tire (35 cm) | 1 | 433 MHz (RF) | 5 | 1 | 1 |
| 22 cm$^2$ * 2 (bimorph) | Truck Tire (65 cm) | 2.3 | 2.4 GHz | 15 | 8 | 1 |

It can be seen from the Table 2A that, for the sedan tire, at a speed of 30 km/h, the receiver receives parameter information sent from the inner tire at an interval of 5 seconds. When the speed is increased to above 60 km/h, the sedan tire can achieve a signal transmission frequency of once per second. The truck tire shows similar trend as the sedan tire. However, the diameter of truck tire is considerably larger, and one revolution of the truck tire is more than 4 meters in length, the intervals between power generation due to the deformations of the sedan tire and truck tire touching the ground at a speed of 30 km/h is found to be 0.264 seconds for the sedan tire and 0.49 seconds for the truck tire. As the speed of the tire increases, at a speed of 120 km/h, the truck tire can also achieve Bluetooth signal transmissions almost once every second.

For Table 2B, a second test is conducted at the same testing speeds as the previous test. The only difference is in that the encapsulation support structure and the fixed support structure in the self-powered sensing and transmitting device have matching inclinations as shown in FIG. 4A, such that the self-powered sensing and transmitting device has a smaller radius of curvature than the inner wall of the tire, in other words, it has a more curved initial status.

TABLE 2B

| Area of Piezoelectric Generator (cm²) | Type of Tires Tested (radius of curvature in cm) | Static Capacitance (µF) | Signal Transmission Method | 30 km/h Signal Transmission Interval (sec) | 60 km/h Signal Transmission Interval (sec) | 120 km/h Signal Transmission Interval (sec) |
|---|---|---|---|---|---|---|
| 15 cm² | 16 inch Sedan Tire (35 cm) | 1 | 433 MHz (RF) | 3 | 1 | 1 |
| 22 cm² * 2 (bimorph) | Truck tire (65 cm) | 2.3 | 2.4 GHz | 10 | 5 | 1 |

As can be seen from Table 2B, when the sedan tire is at a low speed of 30 km/h, the signal transmission interval is shortened to about 3 seconds, which means that the self-powered sensing and transmitting device can still capture slow and small changes in mechanical energy (such as when the vehicle is moving through the city slowly or in a traffic jam), and convert the mechanical energy into power required by the tire sensors and the signal transmitter. The results for the truck tire also indicate that the power generation efficiency of the self-powered sensing and transmitting device is improved due to the pre-stress, and as speed increases, the transmission intervals of the Bluetooth signals are greatly reduced to 10 seconds (at 30 km/h), 5 seconds (at 60 km/h) and 1 second (at 120 km/h).

Figure 7:
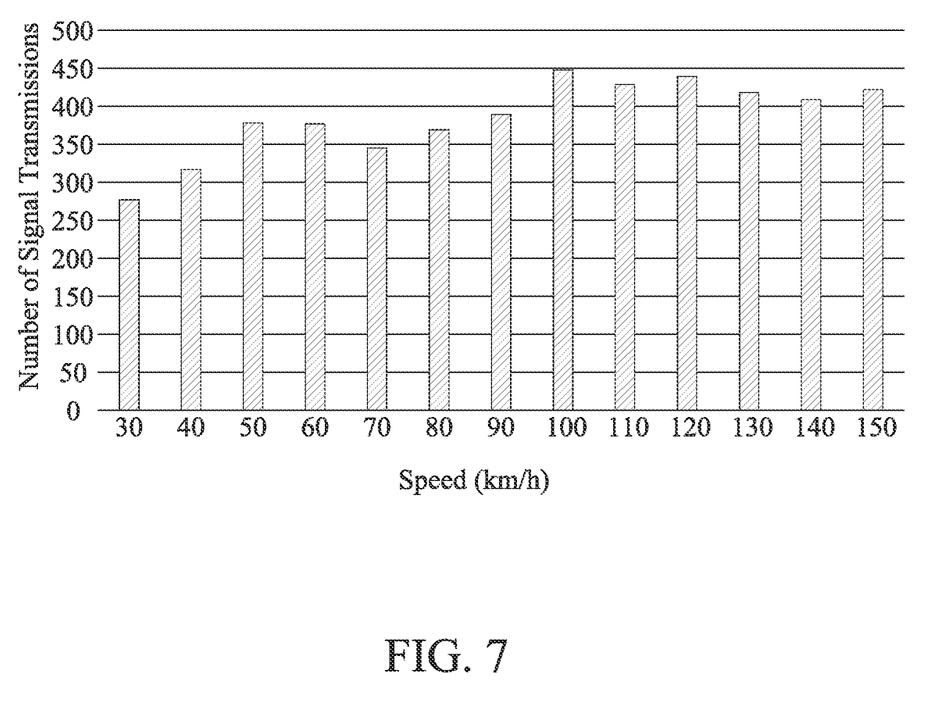
FIG. 7 is a chart illustrating signal transmission results of the self-powered sensing and transmitting device in accordance with the present disclosure.

Referring to FIG. 7, the much larger generator (22 cm²*2 [i.e., bimorph]) is used for testing a sedan tire that is secured in the same way as in the test described with respect to Table 2B, and observations are made on the number of cumulative signal transmissions over a period of time. The speed starts from 30 km/h, and is increased to a maximum speed of 150 km/h sequentially with the duration of each speed being 5 minutes (300 seconds). The results are shown in FIG. 7. The number of signal transmissions is increased since the area of the generator is larger. When the sedan tire is running at low speeds (30-40 km/h), it can transmit tire pressure signals nearly once every second, and as the speed increases, the signal transmission intervals are less than one second in the higher speed range. The total test duration is 3900 seconds from the lowest to the highest speeds, and the receiver receives a total of 5017 signals. As demonstrated in FIG. 7, sending tire pressure signals once per second, or even less than one second, can provide continuous detections of the tire pressure status. Compared to the traditional TPMS with a disposable battery in which signals are transmitted once only every 30 seconds, the detection frequency provided by the self-powered sensing and transmitting device of the present disclosure is significantly higher. This increases the safety factor. For example, if the tire is punctured when on the road, tire pressure will leak quickly. With the self-powered sensing and transmitting device of the present disclosure, it will be possible to accurately determine the tire pressure in real time whether the tire is studded or punctured by a foreign object. Furthermore, during replacement of the tire, the encapsulation support structure of the self-powered sensing and transmitting device can be removed from the fixed support structure. After another tire provided with a fixed support structure is fitted, the encapsulation support structure can then be correspondingly coupled to the fixed support structure of the new tire for further sensing of tire pressure, temperature, acceleration, etc.

Referring to FIG. 8, a system includes a plurality of the self-powered sensing and transmitting devices 10, 10', wherein one of one or more self-powered sensing and transmitting devices 10, 10' is provided on the inner surface of the shoe 30 near a toe of the shoe 30, and another one of the self-powered sensing and transmitting devices 10, 10' is provided on the inner surface of the shoe 30 near a heel of the shoe 30, and wherein one of the encapsulation portions of the encapsulation support structures of the one or more self-powered sensing and transmitting devices 10, 10' is curved in an opposite direction to the encapsulation portion of the encapsulation support structure of the another one self-powered sensing and transmitting device 10 or 10'. The self-powered sensing and transmitting device 10 or 10' of the present disclosure can also be applicable to a motion monitoring system, and can be installed on the inner surface of a shoe 30. In an embodiment, a smart shoe can be provided, in which the self-powered sensing and transmitting device 10 or 10' of the present disclosure can be disposed on the inner surface of the shoe 30 near the toe, sole, heel or other areas of a human foot in order to output sensed data related to the foot, e.g., weight, walking or running status, steps taken or distances travelled during an motion, etc. For example, the self-powered sensing and transmitting device 10 is provided on the inner surface of the shoe 30 near the toe or sole area, and the self-powered sensing and transmitting device 10' is provided on the inner surface of the shoe 30 near the heel area. The radius of curvature of the encapsulation support structure in the self-powered sensing and transmitting device 10 or 10' is smaller than or equal to that of the bottom surface of the shoe where the self-powered sensing and transmitting device 10 or 10' is located, and the bending direction of the encapsulation support structure can be opposite to or the same as that of the bottom surface of the shoe. When the bottom of the shoe touches the ground, mechanical energy is provided to the self-powered sensing and transmitting device 10 or 10', and the thin metal plate in the encapsulation portion is deformed to allow the thin piezoelectric ceramic to convert the mechanical energy into electrical energy to supply power needed for outputting data sensed. As shown in FIG. 8, in an embodiment, the self-powered sensing and transmitting device of the present disclosure is applied to a motion monitoring system, and the self-powered sensing and transmitting devices 10 and 10' are installed on the inner surface (i.e., the flexible surface S) of the shoe 30, one of the self-powered sensing and transmitting devices (shown as the self-powered sensing and transmitting device 10 in FIG. 8) is provided on the inner surface of the shoe near the toe of the shoe, whereas the other one of the self-powered sensing and transmitting devices (shown as the self-powered sensing and transmitting device 10' in FIG. 8) is provided on the inner surface of the shoe near the heel of the shoe, and the encapsulation portion of the encapsulation support structure of the one self-powered sensing and transmitting device is curved in the opposite direction to the encapsulation portion of the encapsulation support structure of the other one self-powered sensing and transmitting device.

In conclusion, the self-powered sensing and transmitting device of the present disclosure is a detachable and reusable device attached to, for example, the inner surface of a tire or the inner bottom surface of a shoe for sensing tire or motion parameters. By capturing the energy of the rotating tire (the shoe in motion), power can be provided to the sensing module (for sensing temperature, pressure, acceleration, etc.) and the signal transmission module. The self-powered sensing and transmitting device of the present disclosure captures the changes in mechanical energy from the tire (shoe) in contact with the ground using an ultra-thin piezoelectric ceramic capable of converting mechanical energy to electrical energy. The ultra-thin piezoelectric ceramic attached to the inner surface of the tire (or the inner bottom surface of the shoe) has a radius of curvature smaller than or equal to that of the inner surface of the tire (or the inner bottom surface of the shoe). When the self-powered sensing and transmitting device is continuously subjected to the changes in mechanical energy from the tire (shoe) touching the ground, the piezoelectric ceramic is stretched in the lengthwise direction, its thickness changes and thus creates electrical energy that is sufficient for powering the sensing module and signal transmission module to sense and transmit real-time parameter signals, such as pressure and/or temperature, thereby addressing the issues associated with the traditional TPMS with disposable batteries. Moreover, the self-powered sensing and transmitting device of the present disclosure can also be detached and reused, so when a tire has reached the end of its life, the self-powered sensing and transmitting device can be reinstalled on a new tire, which is both environmental friendly and economical.

The above embodiments are set forth to illustrate the principles of the present disclosure, and should not be interpreted as to limit the present disclosure in any way. The above embodiments can be modified by one of ordinary skill in the art without departing from the scope of the present disclosure as defined in the appended claims.

What is claimed is:

1. A self-powered sensing and transmitting device, comprising:
   a piezoelectric generator;
   a carrying structure stacked with the piezoelectric generator;
   an encapsulation support structure including an encapsulation portion encapsulating the piezoelectric generator and the carrying structure, and the encapsulation support structure including two supporting portions connected to two ends of the encapsulation portion, wherein the encapsulation portion and the two supporting portions are basically integrally formed, such that the two supporting portions support the encapsulation portion and allow the encapsulation portion in which the piezoelectric generator and the carrying structure are encapsulated to vibrate under support of the two supporting portions; and
   a fixed support structure for being correspondingly coupled with the two supporting portions and fixed on a flexible surface, wherein the fixed support structure and the two supporting portions are physically coupled together in an embedded fashion and are detachable from each other.

2. The self-powered sensing and transmitting device of claim 1, wherein the fixed support structure is correspondingly coupled with the two supporting portions, such that a radius of curvature of the encapsulation portion is smaller than or equal to a radius of curvature of the flexible surface.

3. The self-powered sensing and transmitting device of claim 1, wherein the encapsulation portion is closer to the flexible surface than the two supporting portions.

4. The self-powered sensing and transmitting device of claim 1, wherein the encapsulation portion is further away from the flexible surface than the two supporting portions.

5. The self-powered sensing and transmitting device of claim 1, wherein the fixed support structure is correspondingly coupled with the two supporting portions, such that the encapsulation portion partially touches the flexible surface or the encapsulation portion does not touch the flexible surface at all.

6. The self-powered sensing and transmitting device of claim 1, wherein the fixed support structure includes two first mating components, and each of the two supporting portions includes a second mating component correspondingly coupled with a respective first mating component.

7. The self-powered sensing and transmitting device of claim 6, wherein the fixed support structure is fixed on the flexible surface, and the two first mating components are progressively closer to each other as the two first mating components extend in a direction away from the flexible surface.

8. The self-powered sensing and transmitting device of claim 6, wherein the fixed support structure is fixed on the flexible surface, and the two first mating components are progressively further apart from each other as the two first mating components extend in a direction away from the flexible surface.

9. The self-powered sensing and transmitting device of claim 6, wherein the first mating components are convex components, and the second mating components are concave components.

10. The self-powered sensing and transmitting device of claim 6, wherein the first mating component includes a head portion and a neck portion, and the second mating component includes a through hole penetrating through the support portion and an opening extending from the through hole to an edge of the support portion, a size of the opening being smaller than or equal to a size of the neck portion.

11. The self-powered sensing and transmitting device of claim 1, wherein the encapsulation support structure is made of rubber, silicone or plastic.

12. The self-powered sensing and transmitting device of claim 1, further comprising a circuit module and connectors, wherein the circuit module is connected to the piezoelectric generator and the carrying structure via the connectors, and the circuit module and the connectors are encapsulated by the encapsulation portion of the encapsulation support structure.

13. The self-powered sensing and transmitting device of claim 12, wherein the circuit module includes a rectifier, an electrical storage and a sensor.

14. The self-powered sensing and transmitting device of claim 13, wherein when the flexible surface is deformed, mechanical energy is transferred to the encapsulation portion of the encapsulation support structure, and to the piezoelectric generator through the carrying structure, electrical energy is then generated by the piezoelectric generator and transmitted to the electrical storage via the rectifier, and the electrical energy is then provided from the electrical storage to the sensor.

15. The self-powered sensing and transmitting device of claim 1, wherein the piezoelectric generator includes a piezoelectric thin film and two conductive electrodes disposed at two sides of the piezoelectric thin film.

16. The self-powered sensing and transmitting device of claim 1, wherein the piezoelectric generator is stacked on one side or two opposite sides of the carrying structure.

17. The self-powered sensing and transmitting device of claim 1, wherein the piezoelectric generator is formed of a plurality of separate units and each of the units is individually stacked on the carrying structure.

18. The self-powered sensing and transmitting device of claim 1, wherein the piezoelectric generator is one single unit and stacked on the carrying structure.

19. The self-powered sensing and transmitting device of claim 1, which is applied to a tire monitoring system, wherein the flexible surface is an inner surface of a tire.

20. The self-powered sensing and transmitting device of claim 1, which is applied to a motion monitoring system, wherein the flexible surface is an inner surface of a shoe.

21. A system comprising a plurality of the self-powered sensing and transmitting device of claim 20, wherein one of one or more self-powered sensing and transmitting devices is provided on the inner surface of the shoe near a toe of the shoe, and another one of the self-powered sensing and transmitting devices is provided on the inner surface of the shoe near a heel of the shoe, and wherein one of the encapsulation portions of the encapsulation support structures of the one or more self-powered sensing and transmitting devices is curved in an opposite direction to the encapsulation portion of the encapsulation support structure of the another one self-powered sensing and transmitting device.

* * * * *